(12) United States Patent
Trimberger

(10) Patent No.: US 7,187,597 B1
(45) Date of Patent: Mar. 6, 2007

(54) INTEGRATED CIRCUIT WITH CIRCUITRY FOR OVERRIDING A DEFECTIVE CONFIGURATION MEMORY CELL

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 6 days.

(21) Appl. No.: 11/218,415

(22) Filed: Sep. 1, 2005

(51) Int. Cl.
*G11C 7/00* (2006.01)
*G11C 8/00* (2006.01)

(52) U.S. Cl. .................................. 365/189.12; 365/200
(58) Field of Classification Search ................ 365/200, 365/189.01, 189.12
See application file for complete search history.

(56) References Cited

U.S. PATENT DOCUMENTS

| | | | |
|---|---|---|---|
| 5,255,370 A | * | 10/1993 | Sako et al. .................... 710/52 |
| 5,485,102 A | | 1/1996 | Cliff et al. |
| 5,778,439 A | * | 7/1998 | Trimberger et al. ........ 711/153 |
| 6,094,385 A | | 7/2000 | Trimberger |

OTHER PUBLICATIONS

U.S. Appl. No. 11/055,475, filed Feb. 10, 2005, Vadi.
XILINX, Inc., "Virtex Series Configuration Architecture User Guide", XAPP151, Oct. 20, 2004, pp. 1-45, (v1.7), available from Xilinx, Inc., 2100 Logic Drive, San Jose, CA 95124.

* cited by examiner

*Primary Examiner*—Son T. Dinh
(74) *Attorney, Agent, or Firm*—W. Eric Webostad

(57) ABSTRACT

An integrated circuit and a method for configuring programmable logic thereof are described. A data register and an address register are coupled to an array of memory cells of the integrated circuit. Address storage is configurable for storing an address associated configuration data targeted for being written to at least one defective memory cell of the array of memory cells. Data storage is configured to store the configuration data associated with the at least one defective memory cell. A controller is configured to cause the address to be loaded into the address register and the configuration data to be loaded into the data register. The controller is configured to maintain a write state for continually writing the configuration data to the array of memory cells responsive to the address during operation of the integrated circuit.

20 Claims, 5 Drawing Sheets

INTEGRATED CIRCUIT WITH CIRCUITRY FOR OVERRIDING A DEFECTIVE CONFIGURATION MEMORY CELL

FIELD OF THE INVENTION

One or more aspects of the invention relate generally to integrated circuits and, more particularly, to overriding a defective configuration memory cell of a programmable logic device.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, PLDs employed spare configuration memory cells for defective configuration memory cells. Using this spare memory cells technology, yield rates of programmable logic devices were increased. A significant portion of a PLD is consumed by spare configuration memory cells and associated circuitry for effectively splicing in such spare configuration memory cells in place of defective configuration memory cells.

Accordingly, it would be desirable and useful to provide a PLD with circuitry for overcoming at least one defective memory cell without the overhead associated with spare configuration memory cells.

SUMMARY OF THE INVENTION

One or more aspects of the invention generally relate to integrated circuits and, more particularly, to overriding a defective configuration memory cell of a programmable logic device.

An aspect of the invention is an integrated circuit. The integrated circuit includes an array of memory cells. A data register and an address register are coupled to the array of memory cells. A controller is coupled to the data register and to the address register. Address storage is coupled to the controller, the address storage configurable for storing an address associated with at least one defective memory cell of the array of memory cells within a group of memory cells of the array of memory cells. Data storage is coupled to the controller, the data storage configured to store configuration data associated with the group of memory cells of the array of memory cells. The configuration data is part of configuration information for configuration of the integrated circuit. The controller is configured to cause the address to be loaded into the address register and the configuration data to be loaded into the data register responsive to configuration of at least a portion of the array of memory cells. The controller is also configured to maintain a write state for continually writing the configuration data to the group of memory cells of the array of memory cells as addressed responsive to the address during operation of the integrated circuit configured with the configuration information.

Another aspect of the invention is a method for configuring programmable logic of a programmable logic device. The programmable logic device is tested to identify at least one defective configuration memory cell. An address is stored in the programmable logic device. The address is associated with the at least one defective configuration memory cell identified. A configuration bitstream is loaded into the programmable logic device. The configuration bitstream includes configuration data associated with the at least one defective configuration memory cell identified. The programmable logic device is programmed responsive to the configuration bitstream. The programming includes identifying the address in the configuration bitstream; storing the configuration data in the programmable logic device; and maintaining a write status for the at least one defective memory cell for continuously writing the configuration data thereto responsive to the address and the configuration data stored.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
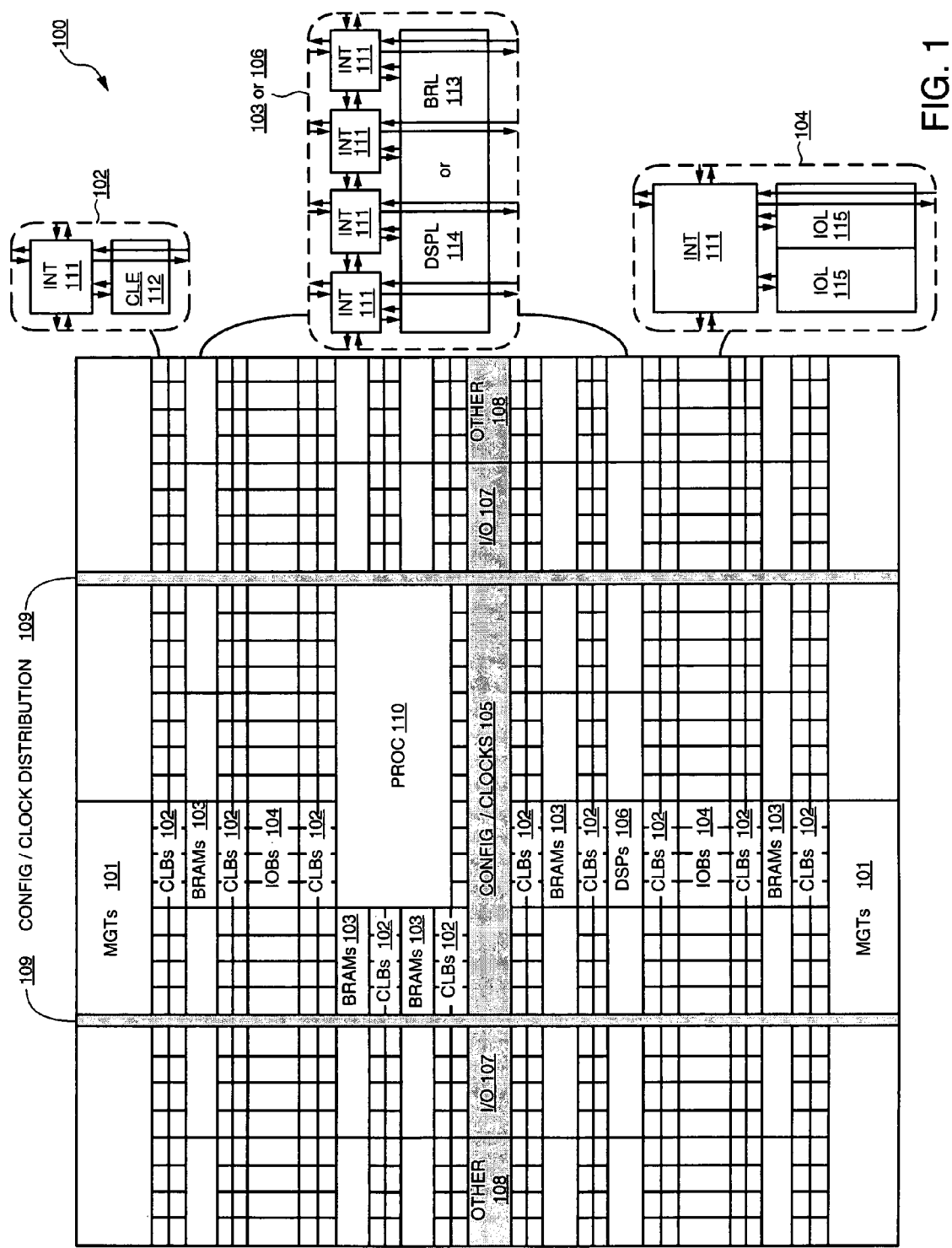
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2A:
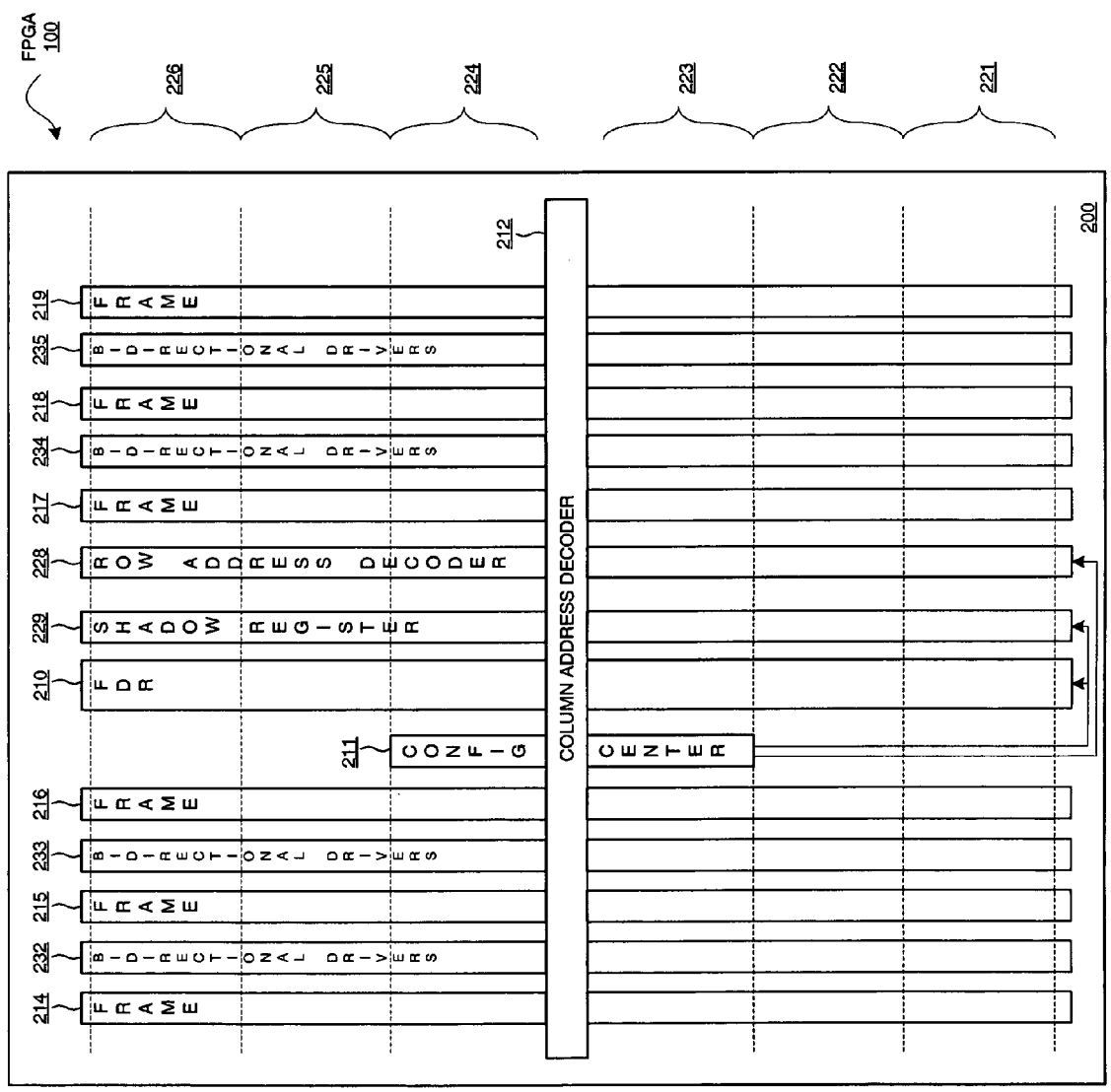
FIG. 2A is a simplified block diagram depicting an exemplary embodiment of a frame arrangement for a configuration plane of an FPGA.

FIG. 2A is a simplified block diagram depicting an exemplary embodiment of a frame arrangement for a configuration plane 200 of an FPGA 100. Configuration plane 200 includes rows 221 through 226, configuration memory frames ("frames") 214 through 219, bidirectional drivers 232 through 235, configuration center control logic ("configuration center") 211, frame data register ("FDR") 210, shadow register 229, row address decoder 228, and column address decoder 212. In this exemplary embodiment of configuration plane 200, a centralized column address decoder 212 is illustratively shown.

Figure 2B:
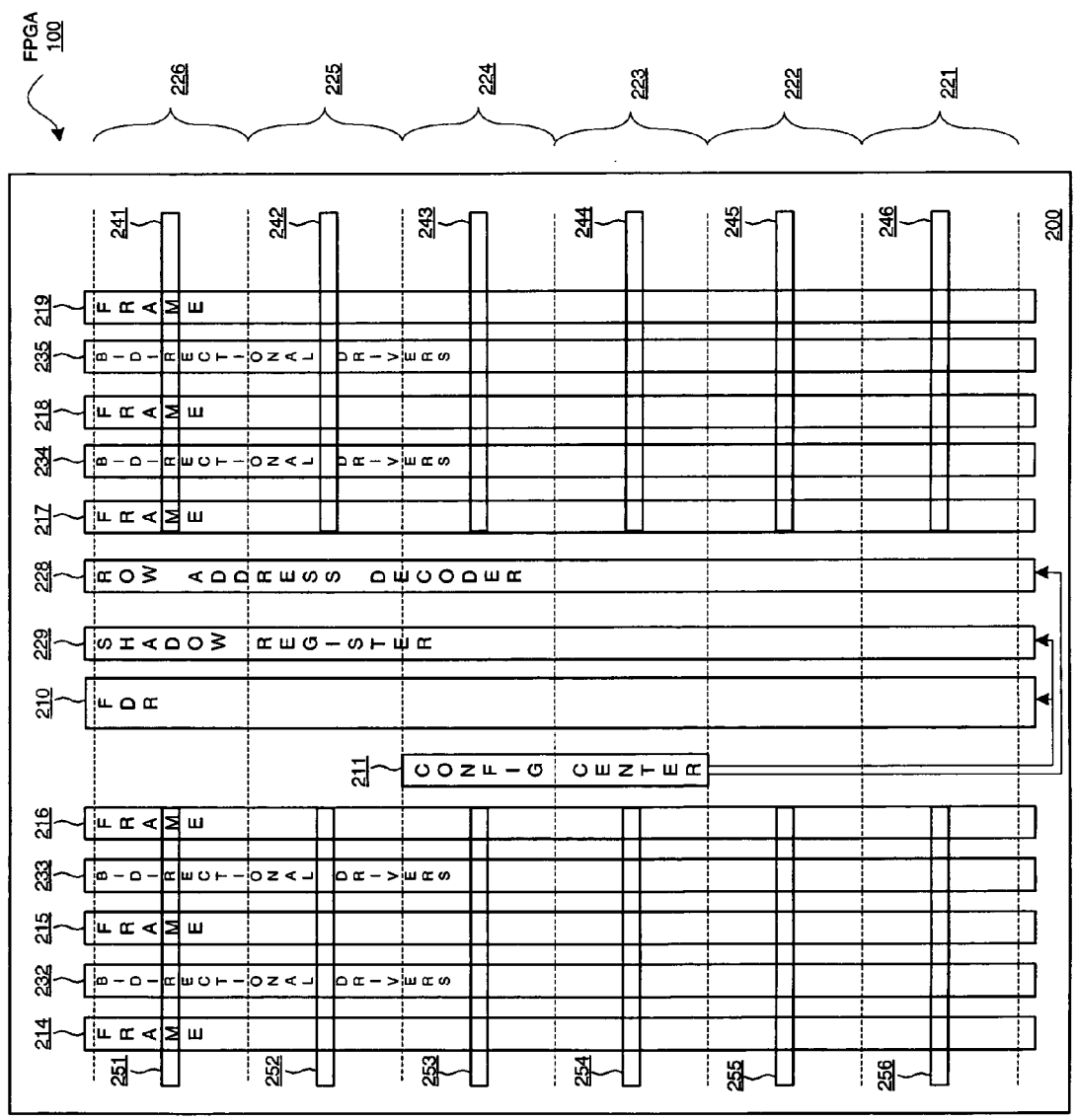
FIG. 2B is a simplified block diagram depicting an alternate exemplary embodiment of the configuration plane of FIG. 2A.

In FIG. 2B, there is shown a simplified block diagram depicting an alternate exemplary embodiment of configuration plane 200 of FIG. 2A. In this exemplary embodiment of configuration plane 200, column address decoder 212 of FIG. 2A is decentralized into respective sections for each row 221 through 226. For example, to the right of FDR 210 are column address decoders 241 through 246 respectively for rows 226 through 221 and to the left of FDR 210 are column address decoders 251 through 256 respectively for rows 226 through 221.

Figure 3:
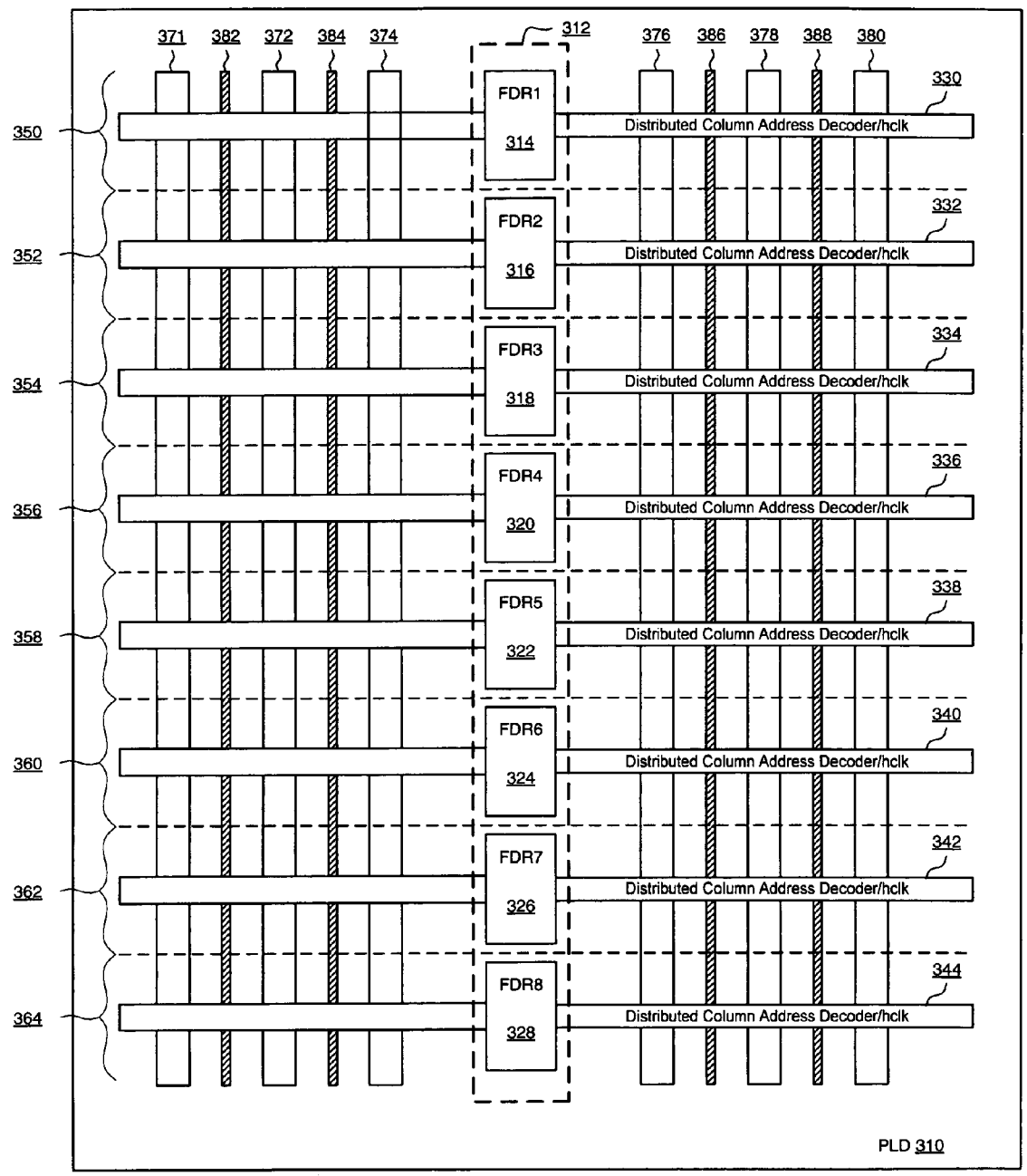
FIG. 3 is a simplified diagram of part of an exemplary embodiment of a configuration structure for a programmable logic device ("PLD").

Continuing the embodiment of FIG. 2B, namely segmentation by rows for column address decoding, FIG. 3 is a simplified diagram of part of an exemplary embodiment of a configuration structure for a PLD 310. The configuration structure may include part of a two-dimensional configuration memory array of configurable memory cells. The memory array is arranged in a series of columns 371, 372, 374, 376, 378, and 380 and a series of rows 350, 352, 354, 356, 358, 360, 362, and 364. Each column includes one or more sub-columns of memory cells (not shown in FIG. 3), where a sub-column stores a fixed frame of configuration data and has a minor address. The column has a major address. Hence the column address for a fixed frame may include a column type, major address, and minor address as in conventional FPGAs. Further description of major and minor column addressing is found in an Xilinx Application Note entitled "Virtex Series Configuration Architecture User Guide" from Xilinx, Inc. of San Jose, Calif., XAPP151, Mar. 24, 2003. Interposed between the columns 371 through 380 may be dataline drivers, also known as repeater circuits, 382, 384, 386, and 388.

Each of the rows 350 through 364 includes FDRs ("FDR1" through "FDR8") 314, 316, 318, 320, 322, 324, 326, and 328, collectively labeled FDR 312, and distributed column address decoder/HCLK (e.g., H-clock tree) rows 330, 332, 334, 336, 338, 340, 342, and 344, respectively. For example, to configure column 371 in row 352, bitstream data is first sent to FDR2 316 (serially or in parallel or a combination thereof) from the configuration center (not shown). Next, the data in FDR2 316 is transferred to the configuration memory cells in column 371 in row 352. The dataline drivers in columns 382 and 384 will restore the digital bitstream data as it moves across row 352 from FDR2 316 to column 371. For reading back the configuration memory cell data in column 371 of row 352, the data is sent back in parallel to FDR2 316 from column 371 of row 352 and then read (serially or in parallel or a combination thereof) from FDR2 316 to the configuration center (not shown). Additional details regarding PLD 310 may be found in a co-pending United States Patent Application entitled "Bidirectional Register Segmented Data Busing" by Vasisht Mantra Vadi, application Ser. No. 11/055,475, filed Feb. 10, 2005, which is herein incorporated by reference.

Figure 4:
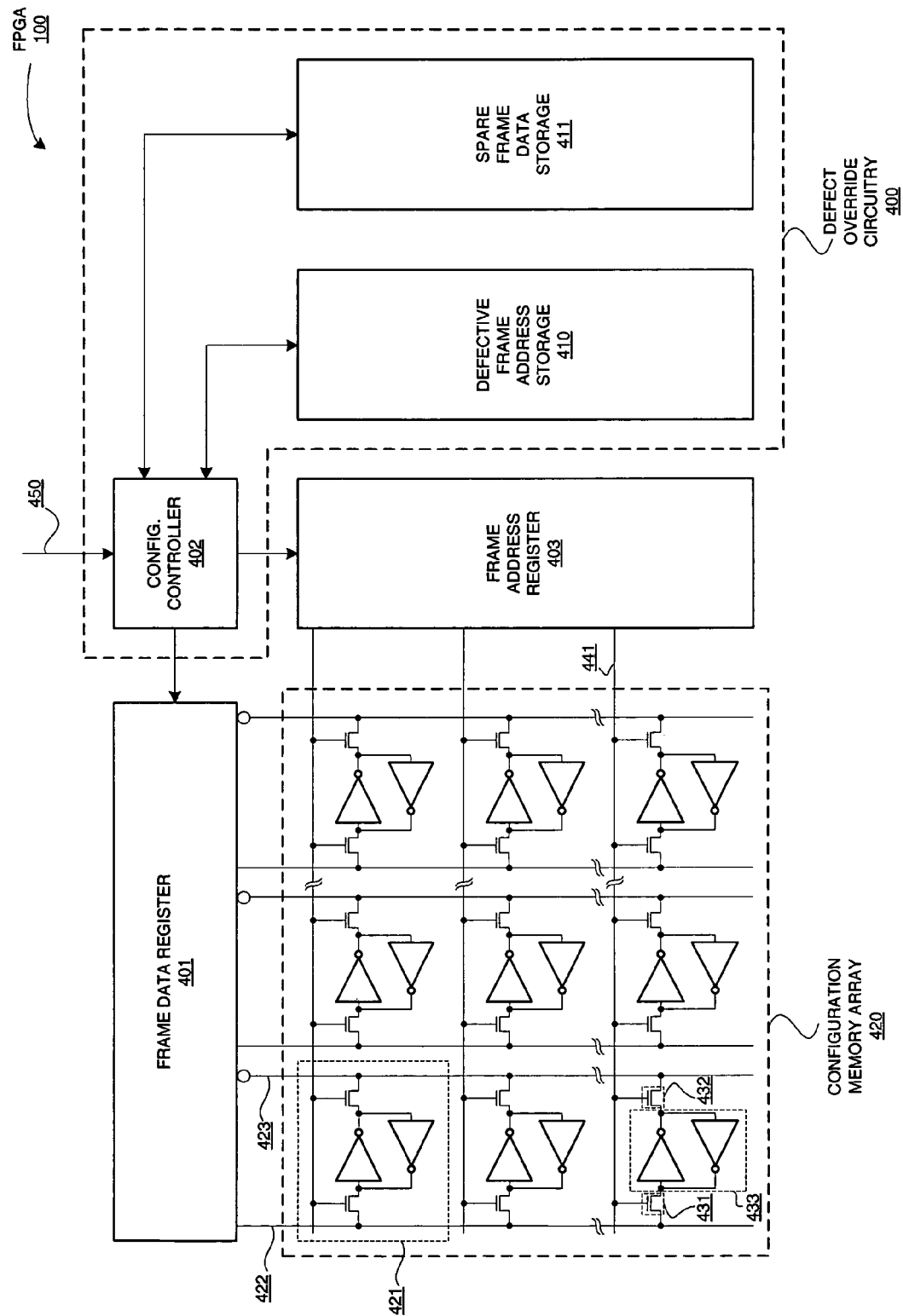
FIG. 4 is a high-level block/schematic diagram depicting an exemplary embodiment of the FPGA of FIG. 1 including defect override circuitry.

FIG. 4 is a high-level block/schematic diagram depicting an exemplary embodiment of FPGA 100 including defect override circuitry 400. Defect override circuitry 400 includes configuration controller 402, defective frame address storage 410, and spare frame data storage 411.

As is known, an FDR 401, which may be an FDR as described with reference to FIG. 2A, 2B, or 3, is coupled to an array of configuration memory cells, namely configuration memory array 420. Memory cells 421 of configuration memory array 420 may be associated with configuration memory frames. In this particular implementation, a data output 422 and an inverted data output 423 are provided from FDR 401 to respective data pass transistors, such as transistors 431 and 432, of a memory cell, such as one of memory cells 421. Both data and inverted data are used to write data to a configuration memory cell. Using both data signals 422 and 423, data may be written more quickly than if only one of data signals 422 or 423 were used.

Data pass transistors, such as data pass transistors 431 and 432, are gated by address signals, such as address signal 441 from frame address register 403. Frame address register 403 may be an address decoder, as previously described with reference to FIGS. 2A, 2B, and 3. Each configuration memory cell may have cross-coupled inverters to provide a latch, such as latch 433. Thus, configuration data, such as from a configuration bitstream provided to FPGA 100 may be registered on a frame-by-frame basis in FDR 401. Each such frame of configuration data may be written to a frame of configuration memory cells 421 of configuration memory array 420 to a memory array address registered in frame address register 403. Both address information and configuration data are provided via such configuration bitstream for configuring FPGA 100, as is known.

A manufacturer may test FPGA 100 in advance of shipping product. This testing may include testing configuration memory cells 421 of configuration memory array 420. Accordingly, during such testing, location of defective configuration memory cells may be determined. Thus, for example, a memory cell in a group of memory cells such as a frame or word length, may be identified as being defective. Notably, there may be multiple FDRs, such as which collectively may be referred to as an FDR, where each such FDR is associated with a portion of configuration memory of configuration memory array 420. For each such block associated with an FDR, a defective memory cell, or more than one defective memory cell within a same addressable group of memory cells, may be overridden, as described below in additional detail.

An example of a defect associated with such one or more memory cells within an addressable group of memory cells may be an open-circuit condition associated with a storage component, such as latch 433. Notably, other types of storage components, other than a latch 433 may be used. Such defect or defects may be overridden by providing a continuous write state to such one or more memory cells.

After FPGA 100 has been tested and any defective configuration memory cell has been identified, an address associated with each such defective configuration memory cell may be stored. For purposes of clarity by way of example and not limitation, it shall be assumed that FDR 401 is associated with a single block of memory, and thus only one address may be stored in defective frame address storage 410. However, it should be appreciated from the disclosure that multiple defective addresses may be stored for each correspondence of an FDR to a block of configuration memory.

Defective frame address storage 410, which has an address associated with a defective memory cell stored therein, may be implemented with any of a variety of known types of non-volatile memory. Examples of such known non-volatile memory include EEPROMS, flash memory, fuses, anti-fuses, and the like. For purposes of clarity by way of example, it shall be assumed that defective frame address storage 410 is a bank of fuses which are programmed with an address associated with a frame of configuration data to be written to a frame of configuration memory having a defective memory cell. In an embodiment, configuration controller 402 may execute a test of configuration memory array 420 each time FPGA 100 is powered on or periodically while FPGA 100 is operating or a combination thereof. This test may be used to determine the address of any defective frame(s), which may then be stored in defective frame address storage 410. Thus, defective frame address storage 410 may be implemented with any known type of volatile memory. Examples of such known volatile memory include DRAM and SRAM.

Thus, for example, after FPGA 100 has been tested and found to have a defective configuration memory cell that may be overridden by a continuous write state, defective frame address storage 410 may have an address stored therein to identify the defective memory cell in a frame of configuration memory cells.

Responsive to a user loading a configuration bitstream into FPGA 100, configuration data associated with the address stored in defective frame address storage 410 is written to spare frame data storage 411. In other words, the term "spare" is used to indicate that this frame data storage need not be part of configuration memory array 420, but spare data storage devices may be apart from such configuration memory array 420. For example, BRAM rather than configuration memory may be used for spare frame data storage 411. This configuration data written to spare frame data storage 411 may be identified for writing thereto by comparing an address in a configuration bitstream associated with each frame of configuration data with the address stored in defective frame address storage 410. Configuration controller 402, which may or may not be incorporated into a configuration center, such as configuration center 211 of FIGS. 2A and 2B, may be configured to compare configuration address information in configuration bitstream 450 to the address stored in defective frame address storage 410. Notably, configuration data in a configuration bitstream 450 having an address that matches the address stored in defective frame address storage 410 is stored in spare frame data storage 411. Notably, this configuration data may or may not be provided to FDR 401 at this time during the configuration of programmable logic of FPGA 100. Thus, for example, if an address in configuration bitstream 450 is found to match an address in defective frame address storage 410, configuration data associated with the matching address in configuration bitstream 450 may be diverted only to spare frame data storage 411, or alternatively, may be provided to both FDR 401 and spare frame data storage 411.

Notably, though the example herein is in terms of loading of configuration data frame-by-frame, other known increments of data may be loaded. Furthermore, in an implementation where FDR 401 is segmented such that an individual bit, for example, may be asserted without asserting other bits, a single configuration bit associated with the defective memory cell may be stored in spare frame data storage 411 in order to reduce storage space requirements. However, by using a known FDR 401 and frame address register 403, fewer changes to a conventional FPGA may be made in order to provide override capability of a defective memory cell or cells.

After configuration bitstream 450 has completed its load in configuring of programmable logic via configuration memory array 420, configuration controller 402 may be configured to access configuration data stored in spare frame data storage 411 for writing to FDR 401. Additionally, configuration controller 402 may then pass an address stored in defective frame address storage 410 to frame address register 403. At this state, configuration controller 402 may cause FDR 401 and frame address register 403 to continuously be in a write status. Thus, for example, data from FDR 401 may be continuously provided to a frame of configuration memory cells of confirmation memory array 420 associated with an address asserted from frame address register 403. Such data may be provided via data lines, such as data lines 422 and 423. Thus, output from FDR 401 may be used to override status of configuration memory, in particular one or more defective memory cells within a frame of configuration memory cells. Notably, memory cells of configuration memory array 420 may be driven with a higher supply voltage than FDR 401. Thus output from FDR 401 via data signals, such as data signals 422 and 423, may be at a lower voltage level than that used to drive memory cells of configuration memory array 420. Alternatively, FDR 401 may be driven at the same supply voltage level as configuration memory array 420. Alternatively, address signal 441 may be driven with a higher supply voltage than data lines 422 and 423 to reduce voltage drop from data pass transistors 431 and 432.

It should be appreciated that with a reasonably limited amount of overhead, one or more defective memory cells within a same frame as associated with an FDR 401 may be overridden. In other words, output from configuration memory array 420 for such frame of configuration data is provided from FDR 401 for an address stored in frame address register 403. Moreover, spare frame data storage 411 may be implemented using BRAM of FPGA 100 to further reduce adding circuitry to FPGA 100 for implementing defect override circuitry 400.

Notably, not all defects of a configuration memory cell, such as a configuration memory cell 421, may be overridden. For example, for overriding a memory cell in the example implementation, data pass transistors 431 and 432 are used, and thus such transistors may not be defective for this purpose. This is because the output of configuration memory cells, such as to an interconnect multiplexer as is known, passes through data pass transistors 431 and 432. Additionally, latch 433 may not be shorted to a supply voltage or ground. Notably, a short to supply voltage or ground cannot be overridden by FDR 401. Thus, during testing of FPGA 100, the type of defect, as well as the location of such defect, may be identified to determine whether or not overriding via FDR 401 may be used.

In order to determine whether a defective memory cell may be overridden, configuration memory array 420 may be tested using the tests for a fully functional device. This testing may be done by executing tests with the circuitry activated for correcting the defective memory. More specifically, FDR 401 contains correct data and frame address register 403 contains the address of the frame with the defective memory. If the configuration data written matches the configuration data read back, including in particular the configuration data read back from FDR 401, then an override mode may be used. In short, a test operation is used with an override mode to determine if the override mode will work. For a read back operation using FDR 401 in an override mode, when configuration data is read back from configuration memory array 420, if an address read back matches an address stored in defective frame address storage 410, the configuration data stored in either spare frame data storage 411 or in FDR 401 is provided responsive to such match as part of a readback of configuration data. Thus the spare configuration data stored may be inserted in its proper location within a readback bitstream. Notably, readback of FPGA 100 while operating with an instantiated design is not supported by FDR 401 in an override mode.

Accordingly, it should be appreciated that after a memory test, if a defective memory cell is found in a configuration frame, the defect may be overcome by loading the correct configuration data into an FDR and driving configuration memory bitlines from the FDR while the FPGA is operating. Additionally, the frame address register is loaded with an address of the configuration frame containing the defective memory cell. In an override mode configuration, frame data is continually driven from the FDR to the defective memory cell. Notably, buffers in the FDR may be sized such that the correct configuration data registered in the FDR will override any erroneous data in a defective memory cell. Also, by sourcing configuration frame data from a configuration memory bitline source side ("front side") of a configuration memory cell, overriding erroneous data in a defective memory cell is more likely. Additional details regarding front-side sourcing of a configuration memory cell are described in detail in U.S. Pat. No. 6,094,385 B1.

In contrast to adding an additional column of memory cells, a separate spare frame data storage 411 can be used. Alternatively, spare frame data storage 411 may be implemented with an additional column of memory cells, which may result in a smaller implementation than for example using fuses. However, by using a separate spare frame data storage 411 complexity associated with simultaneously addressing a column of memory cells having one or more defective cells and an additional column of memory cells used to replace the defective column may be avoided.

Notably, the types of configuration data frames that may be overridden are limited. For example, frames containing look-up table ("LUT") random access memory ("RAM"), which cannot be overridden, may be associated only with non-defective memory. For example, an error in a LUTRAM bit is not correctable by overriding, but an error in a non-LUTRAM bit may be corrected. Accordingly, by selectively masking output of drivers from an FDR, FDR drivers, such as, buffers associated with LUTRAM may be masked or otherwise disabled for a read back operation and for an override operation. Thus, driving bits associated with a LUTRAM would be selectively masked but other bits in a configuration frame would not be masked. Notably, application of such mask may be associated with the type of frame being corrected.

Notably, partial configuration or reconfiguration of an FPGA may be done. For the example of a six-transistor SRAM cell having two data bits, partial reconfiguration may be done by presenting the corrected data bit on one of the two data bitlines. Reconfiguration may be done on the other bitline of the two bitlines. Notably, this would involve a separate address for each bitline of the two bitlines and another FDR.

Notably, FDR 401 of FIG. 4 may be a separate FDR added in addition to the FDRs described with reference to FIGS. 2A, 2B, and 3. FDR 401 may be used by spare frame data storage 411 in which case configuration bitlines, such as data lines 422 and 423, may be switchably coupled via respective gating transistors (not shown) to such added FDR 401. Thus, in an override mode, an added FDR 401 may be activated by providing a control signal to gates of pass transistors of configuration memory bitlines.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
   an array of memory cells;
   a data register coupled to the array of memory cells;
   an address register coupled to the array of memory cells;
   a controller coupled to the data register and to the address register;
   address storage coupled to the controller, the address storage configurable for storing an address associated with at least one defective memory cell of the array of memory cells within a group of memory cells of the array of memory cells;
   data storage coupled to the controller, the data storage configured to store configuration data associated with the group of memory cells of the array of memory cells, the configuration data being part of configuration information for configuration of the integrated circuit; and
   the controller configured to cause the address to be loaded into the address register and the configuration data to be loaded into the data register responsive to configuration of at least a portion of the array of memory cells and configured to maintain a write state for continually writing the configuration data to the group of memory cells of the array of memory cells as addressed responsive to the address during operation of the integrated circuit configured with the configuration information.

2. The integrated circuit according to claim 1, wherein the array of memory cells includes configuration memory cells associated with configuration of programmable logic of the integrated circuit.

3. The integrated circuit according to claim 2, wherein the configuration information is written to the array of memory cells in frames, wherein the address register is a frame address register, and wherein the data register is a frame data register.

4. The integrated circuit according to claim 3, wherein the frame data register is one of a plurality of frame data registers of the integrated circuit.

5. The integrated circuit according to claim 4, wherein the plurality of frame data registers are respectively associated with sub-arrays of the array of memory cells.

6. The integrated circuit according to claim 2, wherein the array of memory cells is operated at a higher voltage level than the frame data register.

7. The integrated circuit according to claim 2, wherein the integrated circuit is a programmable logic device.

8. The integrated circuit according to claim 2, wherein the address storage is a bank of non-volatile programmable circuits.

9. The integrated circuit according to claim 8, wherein the bank of non-volatile programmable circuits is a bank of fuses.

10. The integrated circuit according to claim 8, wherein the data storage is formed of block random access memory of the integrated circuit.

11. A method for configuring programmable logic of a programmable logic device, comprising:
    testing the programmable logic device to identify at least one defective configuration memory cell;
    storing an address in the programmable logic device, the address associated with the at least one defective configuration memory cell identified;
    loading a configuration bitstream into the programmable logic device, the configuration bitstream including configuration data associated with the at least one defective configuration memory cell identified; and
    programming the programmable logic device responsive to the configuration bitstream, the programming including:
    identifying the address in the configuration bitstream;
    storing the configuration data in the programmable logic device; and
    maintaining a write status for the at least one defective memory cell for continuously writing the configuration data thereto responsive to the address and the configuration data stored.

12. The method according to claim 11, wherein the configuration bitstream is loaded into configuration memory of the programmable logic device.

13. The method according to claim 12, wherein the address is for a group of configuration memory cells of the configuration memory, the group of configuration memory cells including the at least one defective configuration memory cell.

14. The method according to claim 13, wherein the configuration data is for the group of configuration memory cells.

15. The method according to claim 14, wherein the configuration data is a frame of configuration data.

16. The method according to claim 15, wherein the configuration bitstream is loaded frame-by-frame into the configuration memory.

17. The method according to claim 16, wherein after the loading is completed, the programming includes:
    retrieving the configuration data from data storage;
    registering the configuration data retrieved in a frame data register;
    retrieving the address from address storage;
    registering the address retrieved in a frame address register; and
    the maintaining of the write status being for the group of configuration memory cells by continuously asserting the address from the frame address register and the configuration data from the frame data register.

18. The method according to claim 17, wherein the loading includes bypassing an attempt to load the configuration data into the group of configuration memory cells responsive to the identifying of the address in the configuration bitstream.

19. The method according to claim 17, wherein the data storage is formed of block random access memory of the programmable logic device, and wherein the address storage is a bank of non-volatile programmable circuits.

20. The method according to claim 11, wherein the at least one defective configuration memory cell defect is an open circuit in cross-coupled inverters.

* * * * *